United States Patent
Yamanaka (10) Patent No.: US 6,529,537 B2
(45) Date of Patent: *Mar. 4, 2003

(54) SEMICONDUCTOR LASER DEVICE HAVING CONTROLLED OXYGEN CONCENTRATION AT BOUNDARY BETWEEN SEMICONDUCTOR LAYERS AND REFLECTANCE CONTROL LAYER FORMED ON END FACET

(75) Inventor: Fusao Yamanaka, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 94 days.

This patent is subject to a terminal disclaimer.

(21) Appl. No.: 09/782,057

(22) Filed: Feb. 14, 2001

(65) Prior Publication Data

US 2001/0017872 A1 Aug. 30, 2001

(30) Foreign Application Priority Data

Feb. 14, 2000 (JP) ........................... 2000-034630

(51) Int. Cl.$^7$ .............................................. H01S 5/00
(52) U.S. Cl. ................................. 372/49; 372/46
(58) Field of Search ........................ 372/49, 46, 45

(56) References Cited

U.S. PATENT DOCUMENTS

| 4,656,638 A | 4/1987 | Tihanyi et al. ................ 372/49 |
| 6,359,921 B1 * | 3/2002 | Yamanaka ..................... 372/49 |

FOREIGN PATENT DOCUMENTS

| EP | 0 898 345 A2 | 2/1999 | ........... H01S/3/085 |
| JP | 9-162496 | 6/1997 | ............. H01S/3/18 |
| JP | 11-121877 | 4/1999 | ............. H01S/3/18 |

OTHER PUBLICATIONS

Abstract, 09–162496, Jun. 20, 1997.

* cited by examiner

Primary Examiner—Quyen Leung
(74) Attorney, Agent, or Firm—Sughrue Mion, PLLC (57) ABSTRACT

In a semiconductor laser device including a multilayered structure being formed of a plurality of semiconductor layers made of a plurality of group III–V compounds, and having a pair of opposite light-exit end facets; and a reflectance control layer being formed on at least one of the pair of light-exit end facets, and having at least two sublayers. In the semiconductor laser device, a region near a boundary between the multilayered structure and one of the at least two sublayers closest to the semiconductor layers of the reflectance control layer has an oxygen concentration of 15 atomic percent (atm %) or below.

10 Claims, 10 Drawing Sheets

SEMICONDUCTOR LASER DEVICE HAVING CONTROLLED OXYGEN CONCENTRATION AT BOUNDARY BETWEEN SEMICONDUCTOR LAYERS AND REFLECTANCE CONTROL LAYER FORMED ON END FACET

BACKGROUND OF THE INVENTION

1. Field of the Invention

The present invention relates to a semiconductor laser device in which a light-exit end facet is coated with a reflectance control layer.

2. Description of the Related Art

In the conventional semiconductor laser devices, the temperature rise at a resonator facet during a high output power operation is considered to be a limiting factor of the maximum optical output, since a current which does not contribute to light emission is generated due to recombination at the surface of semiconductor layers corresponding to the resonator end facet.

In order to solve the above problem, coating of the resonator facet with a group III nitride having high thermal conductivity is proposed. However, researchers belonging to the present assignee have found that the thermal conductivity is seriously decreases due to oxygen capture by the group III nitride, and therefore the coating of the group III nitride does not function as desired.

The following patent publications disclose examples of coatings of the resonator facets.

(i) Japanese Unexamined Patent Publication, No. 9(1997)-162496 discloses formation of nitrides of Al, Ga, Ti, or Si coating having a thickness of 0.5 to 10 nm on resonator facets. However, the characteristics and reliability of the semiconductor laser device are greatly affected by the oxygen concentration in the nitrides.

(ii) U.S. Pat. No. 4,656,638 discloses formation of a metal layer having a thickness of 10 nm or less on a light-exit end facet of a semiconductor laser device, and formation of a reflectance control layer, made of an oxide such as $Al_2O_3$, on the metal layer, where the metal layer is made of, for example, Al, Si, Ta, V, Sb, Mn, Cr, or Ti. However, the characteristics of the semiconductor laser device deteriorate, and the reliability of the semiconductor laser device decreases, due to oxidation of the metal layer with oxygen which is externally diffused from the semiconductor layers, although the semiconductor surface is passivated by the external diffusion of oxygen.

(iii) Japanese Unexamined Patent Publication, No. 11(1999)-121877 discloses formation of a passivated layer such as a Si layer after removal of oxide from a semiconductor surface. However, the characteristics of the laser are greatly affected by the amount of oxygen in the passivated layer.

As mentioned above, conventionally, there is no effective solution which realizes control of the degree of oxidation at the boundary of the semiconductor layers, raises the COD (catastrophic optical damage) level, and increases reliability of the semiconductor laser device.

SUMMARY OF THE INVENTION

The object of the present invention is to provide a reliable semiconductor laser device in which the degree of oxidation at the light-exit end facet is appropriately controlled.

According to the present invention, there is provided a semiconductor laser device comprising: a multilayered structure being formed of a plurality of semiconductor layers made of a plurality of group III–V compounds, and having a pair of opposite light-exit end facets; and a reflectance control layer being formed on at least one of the pair of light-exit end facets, and having at least two sublayers. In the semiconductor laser device, a region near a boundary between the multilayered structure and one of the at least two sublayers closest to the semiconductor layers of the reflectance control layer of has an oxygen concentration of 15 atomic percent (atm %) or below, where the "atomic percent (atm %)" is a percentage of atoms of an element of interest.

In order to realize a reliable semiconductor laser device, the relationship between the oxygen concentration at the boundary of the semiconductor layers and the characteristics of the semiconductor laser device must be clarified. However, conventionally, the oxygen concentration in the region near the boundary between the multilayered structure and the reflectance control layer has not been clarified on the atomic percentage basis. As described in detail later, the present inventor has clarified the relationship between the oxygen concentration at the boundary of the semiconductor layers and the characteristics of the semiconductor laser device. Such a relationship can be obtained, for example, based on the chemical shift caused by oxidation of a group III element, which is detected by the X-ray photoelectron spectrometry (XPS).

As described in detail later, the above relationship obtained by the present inventor indicates that when the oxygen concentration in the region near the boundary between the multilayered structure and one of the at least two sublayers closest to the semiconductor layers of the reflectance control layer is 15 atomic percent (atm %) or below, the light-exit end facet in the semiconductor laser device according to the present invention causes only a small amount of oxidation in the semiconductor layers and a small metamorphic change in the composition of the semiconductor layers. Therefore, the performance of the reflectance control layer is not degraded. Thus, the characteristics of the semiconductor laser device can be improved, and the reliability of the semiconductor laser device can be increased.

Further, the semiconductor laser device according to the, present invention may also have one or any possible combination of the following additional features (i) to (ix).

(i) The one of the at least two sublayers closest to the semiconductor layers, i.e., the first sublayer, may be made of a group IV element.

Since the group IV element has a function of gettering oxygen, oxygen diffuses into the semiconductor layers and the second or upper sublayers of the reflectance control layer, so that the degradation of the characteristics and the decrease in reliability of the semiconductor laser device can be prevented.

(ii) In the above case (i), the one of the at least two sublayers closest to the semiconductor layers, i.e., the first sublayer, may be made of Si, Ge, or a compound of Si and Ge.

(iii) In the above case (i) or (ii), the one of the at least two sublayers closest to the semiconductor layers, i.e., the first sublayer, may have a thickness of 0.2 to 50 nm.

In the case of (ii) and (iii), oxygen can be further effectively gettered.

(iv) The one of the at least two sublayers closest to the semiconductor layers, i.e., the first sublayer, may be made of at least one metallic element.

(v) In the above case (iv), the one of the at least two sublayers closest to the semiconductor layers, i.e., the first sublayer, may be made of one of Al, Ti, Ta, Mn, Cr, V, and Sb, or a compound of at least two of Al, Ti, Ta, Mn, Cr, V, and Sb.

(vi) In the above case (iv) or (v), the one of the at least two sublayers closest to the semiconductor layers, i.e., the first sublayer, may have a thickness of 0.2 to 5 nm.

Even when the first sublayer is made of at least one metallic element, oxygen in the vicinity of the boundary can be further effectively gettered since the oxygen concentration in the vicinity of the boundary is maintained 15% or below. Thus, oxidation of the first sublayer made of the at least one metallic element can be prevented, and therefore the characteristics of the semiconductor laser device can be improved, and the reliability of the semiconductor laser device can be increased.

(vii) The one of the at least two sublayers closest to the semiconductor layers may be made of a nitride.

(viii) In the above case (iv), the nitrogen in the nitride may be coupled to at least one of B, Al, In, Ga, Si, Ti, and Ta.

(ix) In the above case (vii) or (viii), the one of the at least two sublayers closest to the semiconductor layers may have a thickness of 30 to 1,000 nm.

Since the nitride has a high thermal conductivity, heat generated at the boundary can be effectively dissipated. In addition, according to the present invention the oxygen concentration in the vicinity of the boundary is maintained 15% or below. Therefore, the high thermal conductivity which the nitride inherently has can be maintained, and therefore the decrease in the maximum optical output power due to the facet degradation caused by heat can be prevented.

DESCRIPTION OF PREFERRED EMBODIMENTS

Embodiments of the present invention are explained in detail below with reference to drawings.

First Embodiment

Figure 1:
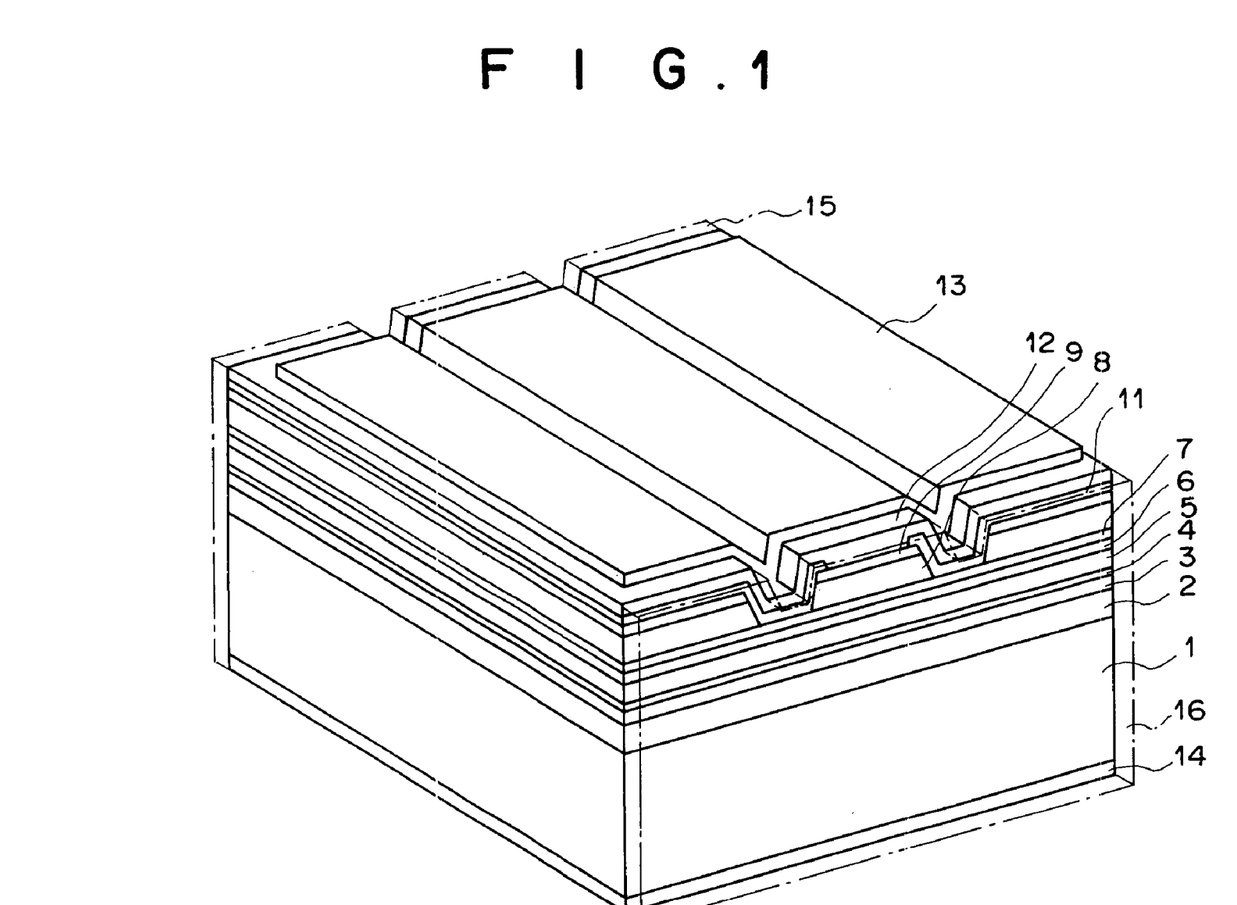
FIG. 1 is a perspective view of a semiconductor laser device as the first embodiment of the present invention.
Figure 2:
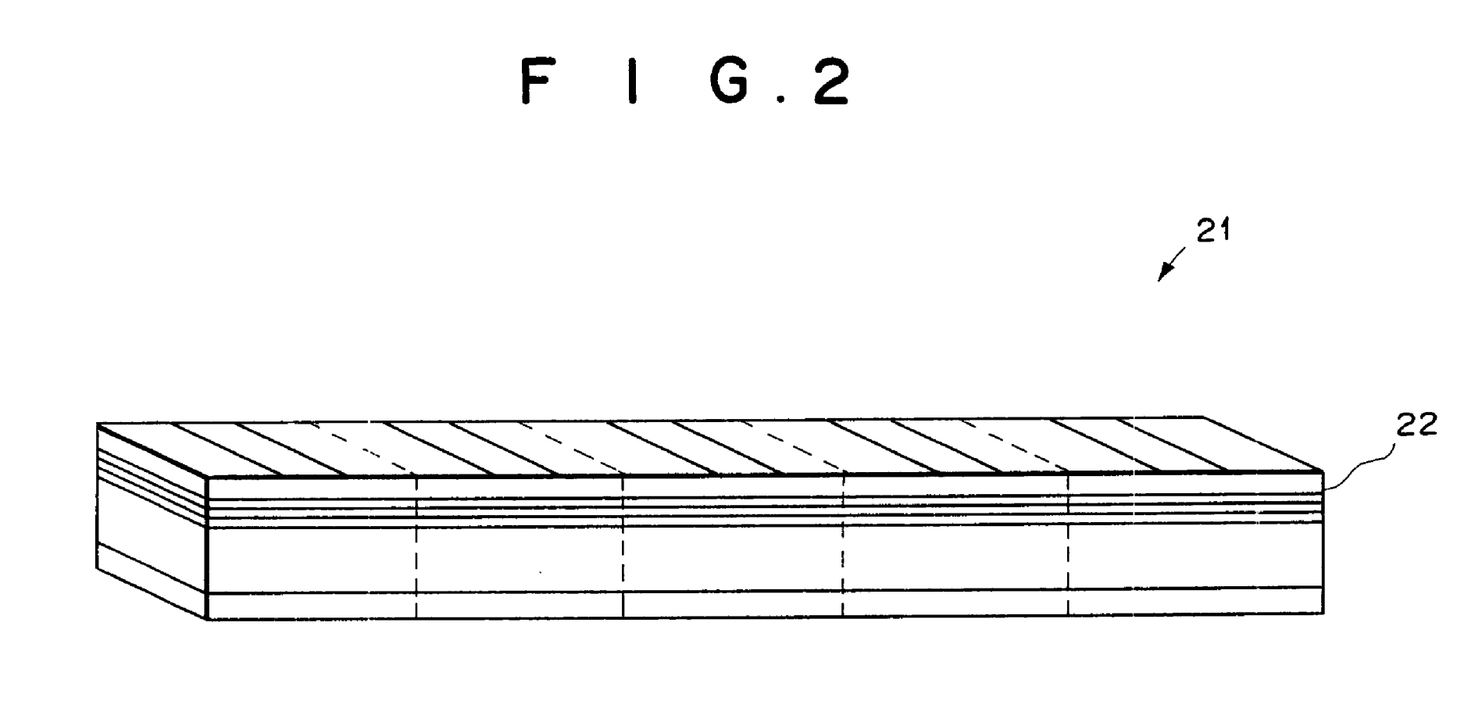
FIG. 2 is a perspective view of a laser bar in which a plurality of semiconductor laser devices are formed.

FIG. 1 is a perspective view of a semiconductor laser device as the first embodiment of the present invention. The construction of FIG. 1 corresponds to a single semiconductor laser device, which is obtained by cleaving a bar (which may be called a laser bar) illustrated in FIG. 2 into pieces. In practice, a plurality of layered structures each corresponding to a semiconductor laser device are concurrently formed on a substrate. Then, the substrate on which the plurality of layered structures are formed is cleaved into a plurality of bars each of which has the construction as illustrated in FIG. 2.

However, for the sake of simplicity of illustration, the formation of the plurality of semiconductor layers on the substrate is explained below with reference to FIG. 1.

As illustrated in FIG. 1, an n-type $Ga_{1-z1}Al_{z1}As$ lower cladding layer 2 ($0.55 \leq z \leq 0.7$), an i-type (intrinsic) $In_{0.49}Ga_{0.51}P$ lower optical waveguide layer 3 having a thickness db of 110 nm, an $In_{x3}Ga_{1-x3}As_{1-y3}P_{y3}$ quantum well active layer 4 having a thickness da of 8 nm, an i-type $In_{0.49}Ga_{0.51}P$ upper optical waveguide layer 5 having a thickness db of 110 nm, a p-type $Ga_{1-z1}Al_{z1}As$ first upper cladding layer 6 having a thickness dc of 100 nm, a p-type $In_{0.49}Ga_{0.51}P$ etching stop layer 7, a p-type $Ga_{1-z1}Al_{z1}As$ second upper cladding layer 8, and a p-type GaAs contact layer 9 are formed on an n-type GaAs substrate 1 by organometallic vapor phase epitaxy. Then, a insulation film (not shown) is formed over the layered structures formed as above.

Thereafter, a ridge stripe structure having a width of about 30 to 250 micrometers is formed as follows. First, two stripe areas of the insulation film, being located on both sides of the ridge stripe structure and each having a width of about 10 micrometers, are removed by the conventional lithography, and portions of the above layered structure under the two stripe areas are then removed to the depth of the upper boundary of the p-type $In_{0.49}Ga_{0.51}P$ etching stop layer 7, by wet etching using the above insulation film as a mask and a solution of sulfuric acid and hydrogen peroxide as an etchant. Due to the use of the solution of sulfuric acid and hydrogen peroxide as an etchant, the wet etching automatically stops at the upper boundary of the p-type $In_{0.49}Ga_{0.51}P$ etching stop layer 7.

Next, the remaining portions of the insulation film are removed, and then another insulation film 11 is formed over the entire surface of the above layered structure. Thereafter, a portion of the insulation film 11 located on the top of the ridge stripe structure is removed along the ridge stripe so as to form a current injection window. Then, a p electrode 12 is formed over the entire surface of the current injection window, and the p electrode 12 is coated with Au plating 13 having a thickness of 5 micrometers or more. Finally, the bottom surface of the n-type GaAs substrate 1 is polished so as to reduce the thickness of the n-type GaAs substrate 1 to 100 to 150 micrometers, and an n electrode 14 is formed on the polished surface.

Each layer in the layered structure illustrated in FIG. 1 may be formed by molecular beam epitaxy using solid or gas raw material.

Although the n-type GaAs substrate is used in the layered structure illustrated in FIG. 1, instead, a p-type GaAs substrate may be used. When the GaAs substrate is a p-type, the conductivity types of all of the other layers in the layered structure illustrated in FIG. 1 should be inverted.

The wavelength 1 of light emitted by the semiconductor laser device of FIG. 1 can be controlled in the range between 750 and 1,100 nm by appropriately adjusting the composition of the $In_{x3}Ga_{1-x3}As_{1-y3}P_{y3}$ quantum well active layer 4 ($0 \leq x3 \leq 0.4$, $0 \leq y3 \leq 0.6$).

In this example, the oscillation wavelength is chosen to be 809 nm. In addition, the stripe width of the above ridge stripe structure is 50 micrometers, and the compositions of the quantum well active layer 4 and the cladding layers 2, 6, and 8 are chosen such that z1=0.64, x3=0.12, and y3=0.24.

As described before, the substrate on which the plurality of layered structures are formed as explained with reference to FIG. 1 are cleaved into a plurality of bars 21 each of which has the construction as illustrated in FIG. 2 and a length of 10 to 20 mm. In this embodiment, the substrate on which the plurality of layered structures are formed is cleaved, in the atmosphere, along such a direction that the (100) face of the GaAs substrate is exposed as portions of light-exit end facets 22 of the plurality of semiconductor laser devices in the bar 21. Further, the above bars are formed so that the resonator length becomes 0.9 mm.

The bar 21 obtained as above is fixed to a jig in the atmosphere for coating of the light-exit end facets 22, and the jig is set in an ECR (electron cyclotron resonance) sputtering system. Then, the ECR sputtering system is evacuated. Since the cleaved surfaces are exposed to the atmosphere after the above cleavage until the evacuation of the ECR sputtering system is completed, the cleaved surfaces are oxidized. When the degree of vacuum in the vacuum chamber 31 reaches $5 \times 10^{-6}$ Pa or below, a milling operation is performed by the ECR sputtering system. Thereafter, a reflectance control layer is formed in the vacuum chamber.

Figure 3:
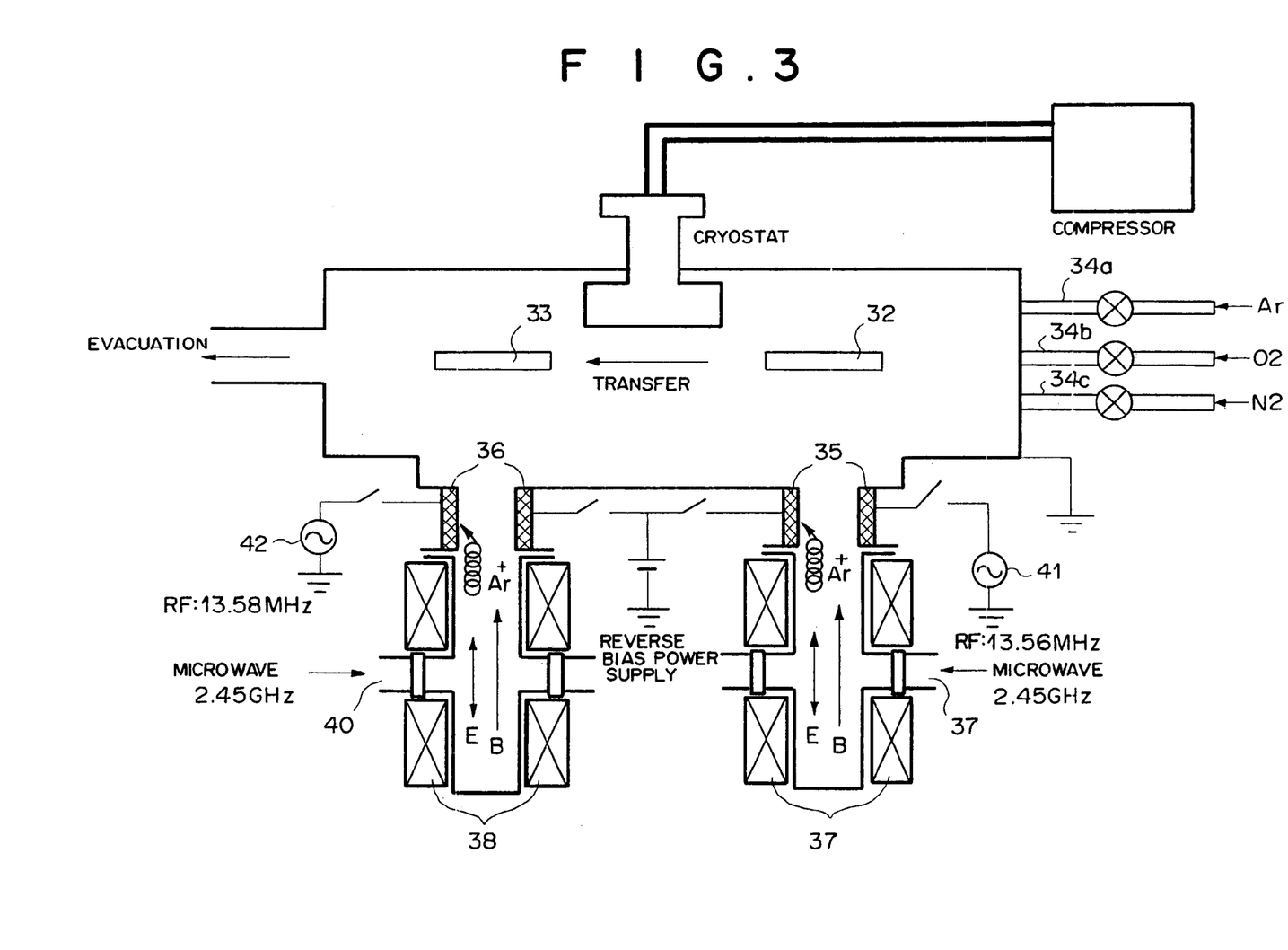
FIG. 3 is a diagram illustrating an ECR (electron cyclotron resonance) sputtering system.

FIG. 3 exhibits the construction of the ECR sputtering system. The ECR sputtering system of FIG. 3 comprises a vacuum chamber 31, gas introduction tubes 34a, 34b, and 34c, a silicon target 35, an aluminum target 36, electromagnetic coils 37 and 38, microwave waveguides 39 and 40, and RF power supplies 41 and 42, where sample tables 32 and 33 are arranged in the vacuum chamber 31, and each of the gas introduction tubes 34a, 34b, and 34c is provided with a valve. The gas introduction tubes 34a, 34b, and 34c are provided for introducing gases into the vacuum chamber 31, and the electromagnetic coils 37 and 38 are provided for accelerating ion beams toward the targets 35 and 36 so that atoms of the targets sputtered by the accelerated ion beams are deposited on the sample.

In the film forming mode, i.e., when a film is formed, an ECR plasma is generated, for example, by introducing Ar gas and microwave into the vacuum chamber 31. The ECR plasma is accelerated toward the sample table by an electromagnetic field generated by the electromagnetic coils. In addition, an electric voltage is applied to the targets. Thus, atoms of the targets sputtered by the accelerated plasma are deposited on the sample so as to form a film.

In the milling mode, i.e., when no electric voltage is applied to the target, the sample is milled with the ECR plasma. The milling operation is performed on the boundary of the semiconductor layers in the milling mode. Since, in this case, the potential of the target is lowered due to induction by the ECR plasma, an appropriate DC bias may be applied to the target in order to raise the potential of the target to −50 V or higher.

Next, the formation of the reflectance control layer is explained below. After the sample undergoes the milling operation, the cryostat in the construction of FIG. 3 is activated when the total pressure reaches $1 \times 10^{-4}$ Pa or below, and evacuation is performed by using the cryostat until the partial pressure of the oxygen and water vapor reaches $3 \times 10^{-6}$ Pa or below. Then, Ar gas is introduced into the ECR sputtering system, and the Ar gas pressure is maintained in the range of 0.8 to $1.1 \times 10^{-1}$ Pa. Under these conditions, using a Si target having a purity of 99.999% or more forms a Si film having a thickness of about 100 nm. Then, an $Al_2O_3$ film having a thickness corresponding to $\gamma/2$ is formed on the Si film. Thus, a reflectance control layer 15 having a reflectance of 32% is formed on one end facet. On the opposite end facet, an multilayer oxide structure 16 having a reflectance of 95% or more is formed. The multilayer oxide structure 16 is comprised of oxide sublayers each having a thickness corresponding to $\gamma/4$. For example, the oxide sublayers are realized by forming $Al_2O_3$ and $SIO_2$ layers five times.

Second Embodiment

Figure 4:
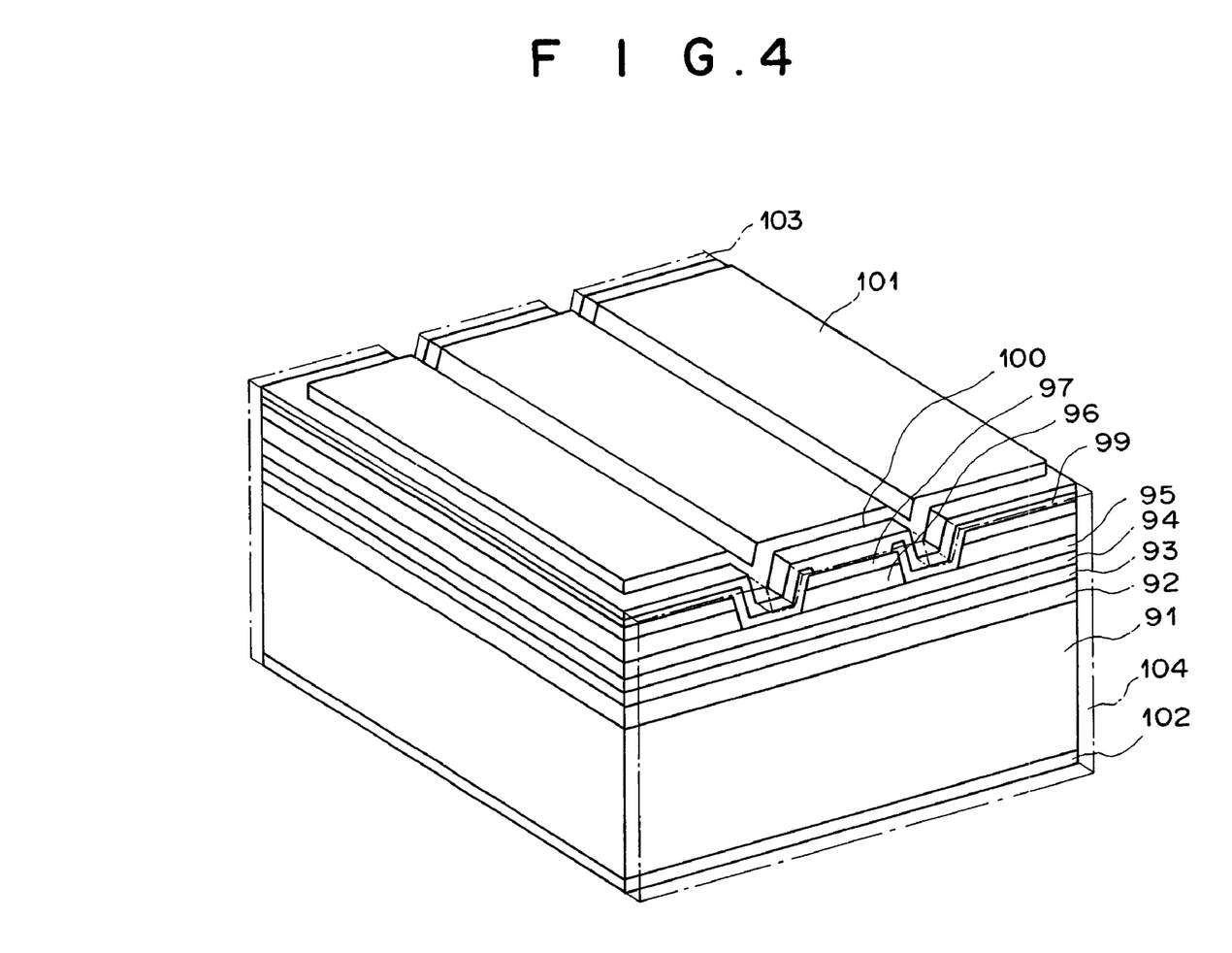
FIG. 4 is a perspective view of a semiconductor laser device as the second embodiment of the present invention.

FIG. 4 is a perspective view of a semiconductor laser device as the second embodiment of the present invention. The construction of FIG. 4 corresponds to a single semiconductor laser device, which is obtained by cleaving a bar (which may be called a laser bar) as illustrated in FIG. 2 into pieces. In practice, a plurality of layered structures each corresponding to a semiconductor laser device are concurrently formed on a substrate. Then, the substrate on which the above plurality of layered structures are formed are cleaved into a plurality of bars each of which has the construction as illustrated in FIG. 2.

However, for the sake of simplicity of illustration, the formation of the plurality of semiconductor layers on the substrate is explained below with reference to FIG. 4.

As illustrated in FIG. 4, an n-type $In_{0.49}(Ga_{1-z1}Al_{z1})_{0.51}P$ lower cladding layer 92 ($0 \leq z1 \leq 0.5$), an i-type $In_{x2}Ga_{1-x2}As_{1-y2}P_{y2}$ lower optical waveguide layer 93 (x2= 0.49y2±0.01, $0.1 \leq y1 \leq 0.9$) having a thickness db of 75 to 400 nm, an $In_{x3}Ga_{1-x3}As_{1-y3}P_{y3}$ quantum well active layer 94 ($0 \leq x3 \leq 0.4$, $0 \leq y3 \leq 0.6$), an i-type $In_{x2}Ga_{1-x2}As_{1-y2}P_{y2}$ upper optical waveguide layer 95 (x2=0.49y2±0.01, $0.1 \leq y1 \leq 0.9$) having a thickness db of 75 to 400 nm, a p-type $In_{0.49}(Ga_{1-z1}Al_{z1})_{0.51}P$ upper cladding layer 96, and a p-type GaAs contact layer 97 are formed on an n-type GaAs substrate 91. Then, an insulation film 98 (not shown) is formed over the layered structures formed as above.

Thereafter, a ridge stripe structure having a width of about 30 to 250 micrometers is formed as follows. First, two stripe areas of the insulation film 98, being located on both sides of the ridge stripe structure and each having a width of about 10 micrometers, are removed by the conventional lithography, and portions of the above layered structure under the two stripe areas are then removed to the depth of the upper boundary of the i-type $In_{x2}Ga_{1-x2}As_{1-y2}P_{y2}$ upper optical waveguide layer 95, by wet etching using the above insulation film 98 as a mask.

Next, the remaining portions of the insulation film 98 are removed, and then another insulation film 99 is formed over the entire surface of the above layered structure. Thereafter, a portion of the insulation film 99 located on the top of the ridge stripe structure is removed along the ridge stripe so as to form a current injection window. Then, a p electrode 100 is formed over the entire area of the current injection window, and the p electrode 100 is coated with Au plating 101 having a thickness of 5 micrometers or more. Finally, the bottom surface of the n-type GaAs substrate 91 is polished, and an n electrode 102 is formed on the polished surface.

The wavelength 1 of light emitted by the semiconductor laser device of FIG. 4 can be controlled in the range between 750 and 1,100 nm by appropriately adjusting the composition of the $In_{x3}Ga_{1-x3}As_{1-y3}P_{y3}$ quantum well active layer 4 ($0 \leq x3 \leq 0.4$, $0 \leq y3 \leq 0.6$).

In this example, the oscillation wavelength is chosen to be 809 nm. In addition, the stripe width of the above ridge stripe structure is 50 micrometers, and the compositions of the quantum well active layer 4 and the cladding layers 2, 6, and 8 are chosen such that z1=0.64, x2=0.49, y2=1, x3=0.12, and y3=0.24.

As described before, the substrate on which the plurality of layered structures are formed as explained with reference to FIG. 4 are cleaved into a plurality of bars each of which has the construction as illustrated in FIG. 2 and a length of 10 to 20 mm. In this embodiment, the substrate on which the plurality of layered structures are formed is cleaved, in the atmosphere, along such a direction that the (100) face of the GaAs substrate is exposed as portions of light-exit end facets of the plurality of semiconductor laser devices in the bar. Further, the above bars are formed so that the resonator length becomes 0.9 mm.

After the milling operation is performed on the cleaved one end facet in the vacuum chamber in a similar manner to the first embodiment, the flow ratio of $N_2$ and Ar is maintained within the range of 0.1 to 0.25, and an AlN film having a thickness corresponding to γ/2 and realizing a reflectance of 32% at the wavelength of 809 nm is formed under the total pressure of 0.8 to $1.1 \times 10^{-1}$ Pa by using an Al target having a purity of 99.999%.

Evaluation

Two types of semiconductor laser devices as each of the first and second embodiments are formed under different oxygen partial pressures, and a depth profile of each of the constituent elements (including N1s, O1s, Al2p, Si2p, Ga3d, and As3d) in the vicinity of the boundary between the semiconductor layers and the first sublayer of the reflectance control layer of each semiconductor laser device is obtained by using the X-ray photoelectron spectrometry (XPS). The details of the measurement conditions are indicated in Table 1a. In order to obtain the depth profiles, the concentrations of the elements are respectively obtained by calculating areas of the N1s, O1s, Al1s, Si2p, Ga3d, and As3d peaks in the spectrum corresponding to the binding energies of the elements, and using the Shirley-type background subtraction method. The ranges of the binding energies corresponding to the N1s, O1s, Al2p, Si2p, Ga3d, and As3d peaks are indicated in Table 1b.

TABLE 1a

XPS Measurement Condition (1) Measuring Equipment: QUANTUM 2000, manufactured by Physical Electronics Inc.
(2) Measurement Condition (a) Excitation X-ray: Monochromatic X-ray (AlKα1:1486.6 eV) generated when an electron beam with a beam diameter of 100 μm and power of 44 W is incident on an Al target.

TABLE 1a-continued

XPS Measurement Condition (b) Analysis Area: 100 μmϕ.
(c) Takeoff Angle: 45 degrees.
(d) Pass Energy: 11.75 eV
(e) Step Width: 0.1 eV.
(3) Etching Condition (a) Accelerating Energy: 0.8 eV.
(b) Etching Rate: 2 nm/min. (in the case of $SiO_2$).

TABLE 1b

Ranges of Binding Energies of Elements

| Photoelectron Peak | Range of Binding Energy |
|---|---|
| O1s | 526–537 eV |
| Ga3d | 15–25 eV |
| As3d | 38–46 eV |
| N1s | 391–402 eV |
| Al2p | 69–80 eV |
| Si2p | 96–106 eV |

Figure 5:
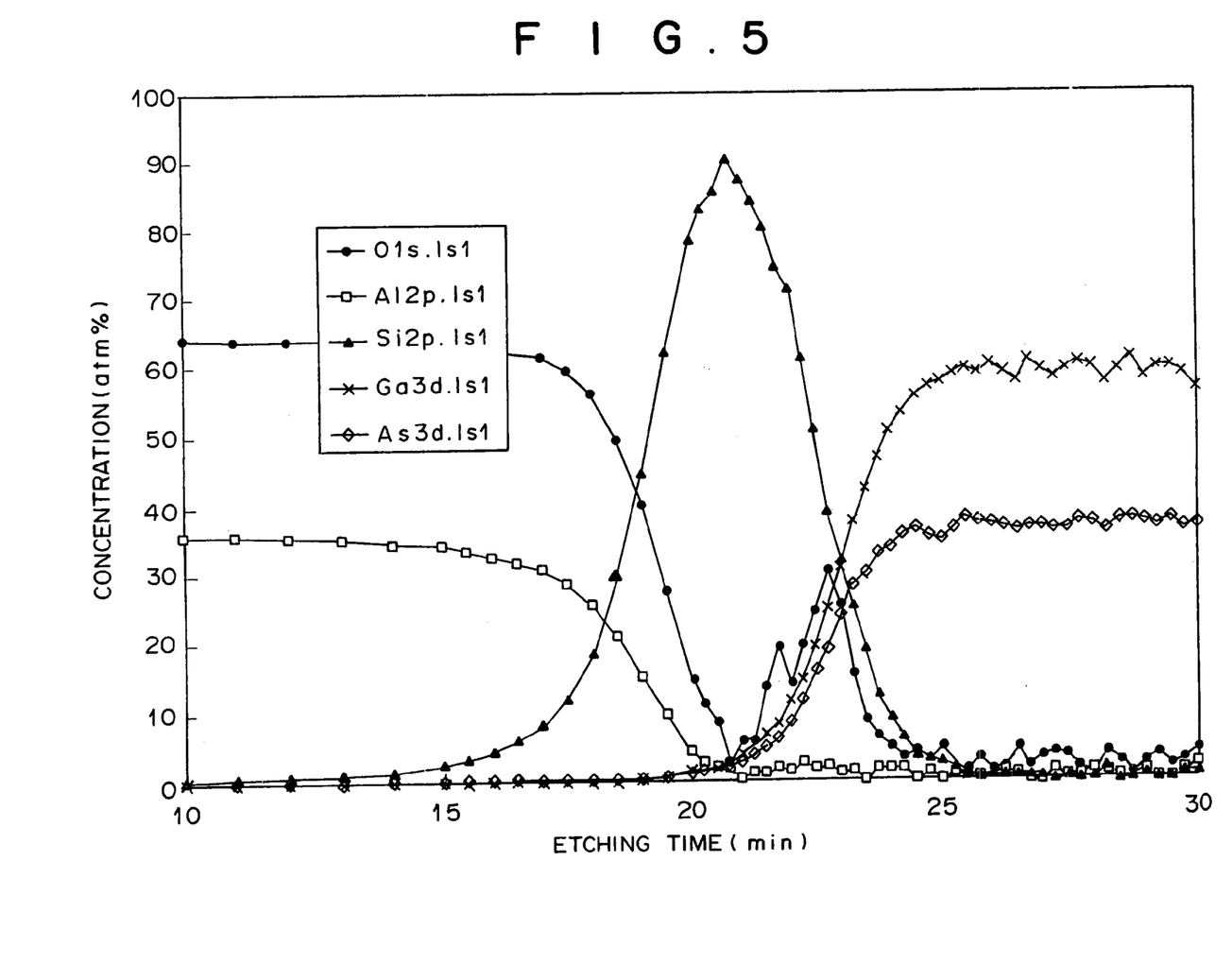
FIG. 5 is a graph indicating a depth profile of each constituent element of the semiconductor laser device as the first embodiment in the case where the reflectance control layer is formed under the residual oxygen partial pressure of $2 \times 10^{-5}$ in the vacuum chamber.
Figure 6:
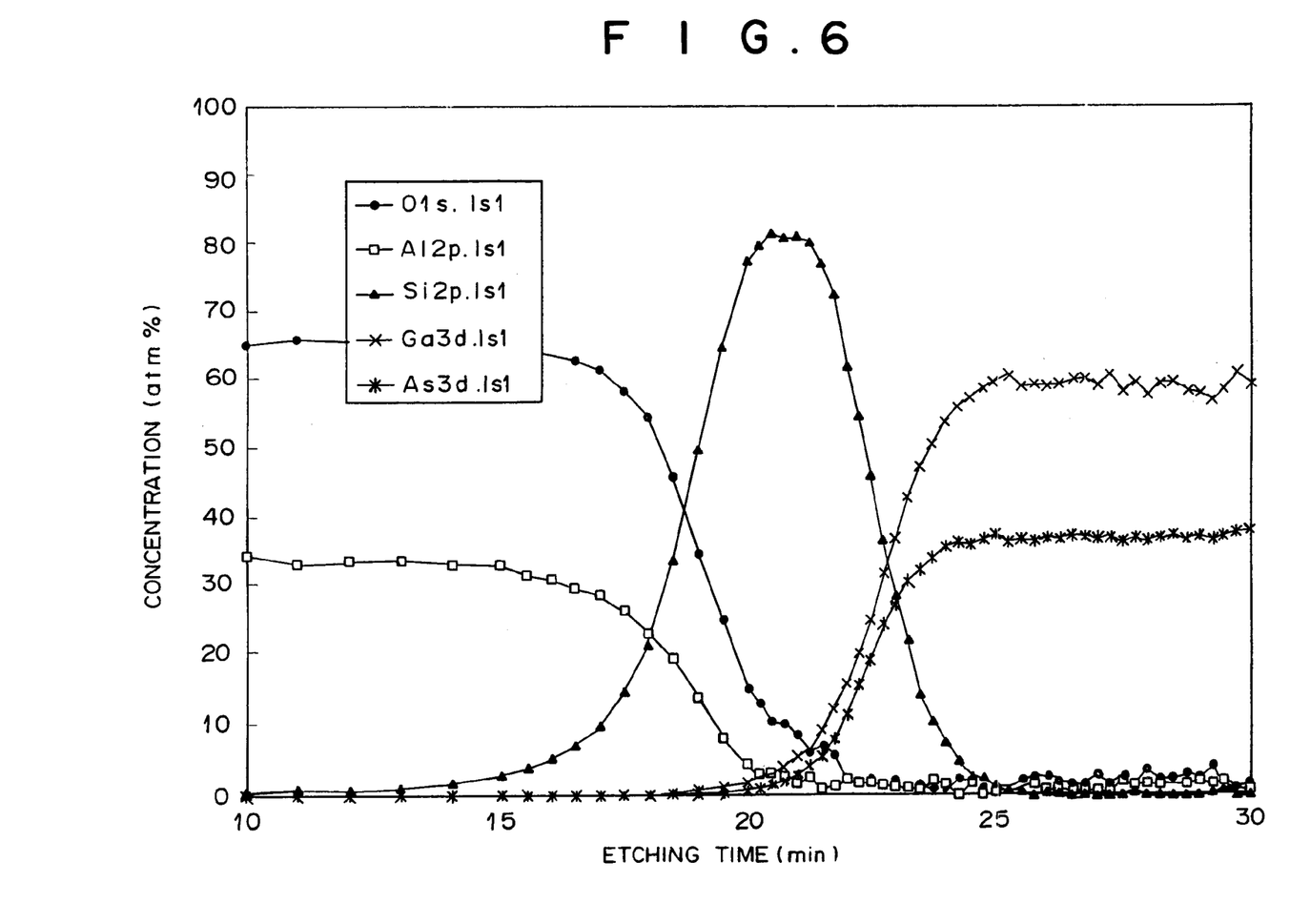
FIG. 6 is a graph indicating a depth profile of each constituent element of the semiconductor laser device as the first embodiment in the case where the reflectance control layer is formed under the residual oxygen partial pressure of $2 \times 10^{-7}$ in the vacuum chamber.
Figure 7:
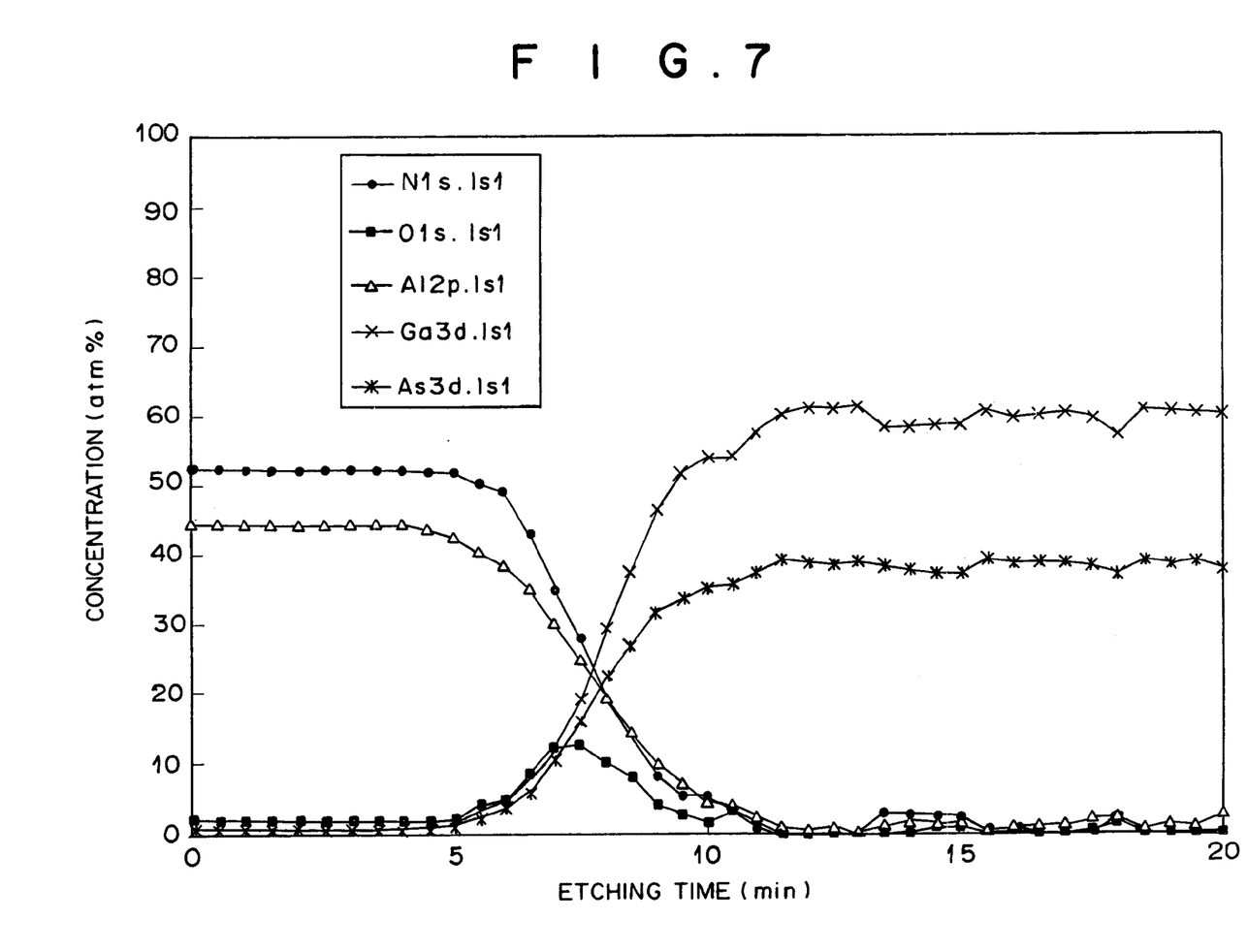
FIG. 7 is a graph indicating a depth profile of each constituent element of the semiconductor laser device as the second embodiment in the case where the reflectance control layer is formed under the residual oxygen partial pressure of $2 \times 10^{-6}$ in the vacuum chamber.
Figure 8:
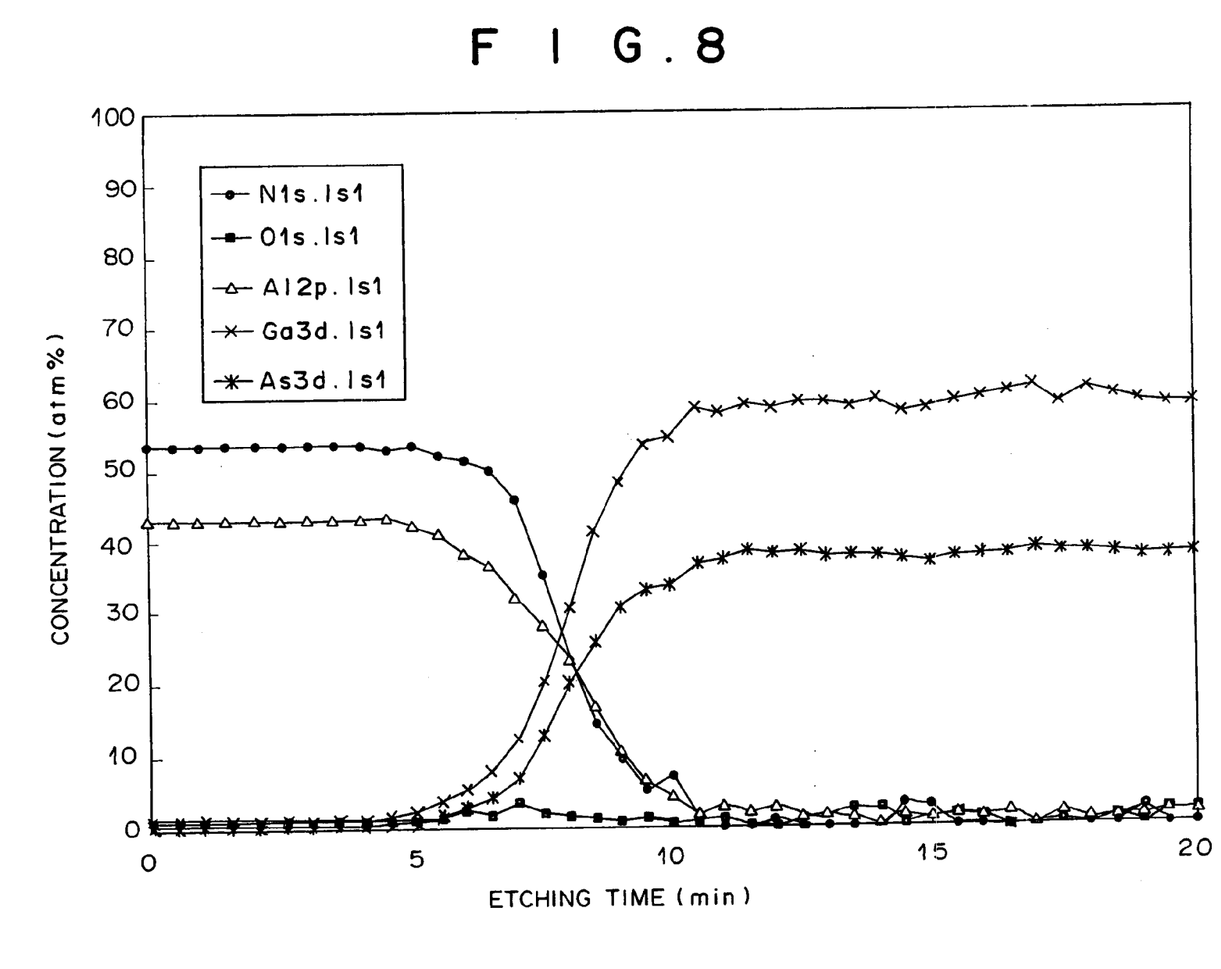
FIG. 8 is a graph indicating a depth profile of each constituent element of the semiconductor laser device as the second embodiment in the case where the reflectance control layer is formed under the residual oxygen partial pressure of $2 \times 10^{-7}$ in the vacuum chamber.

FIGS. 5 and 6 are graphs each indicating a depth profile of each of the constituent elements (N1s, O1s, Al2p, Si2p, Ga3d, and As3d) of the semiconductor laser device as the first embodiment. FIG. 5 indicates the depth profile in the case where the reflectance control layer is formed under the residual oxygen partial pressure of $2 \times 10^5$ in the vacuum chamber, and FIG. 6 indicates the depth profile in the case where the reflectance control layer is formed under the residual oxygen partial pressure of $2 \times 10^{-7}$ in the vacuum chamber. FIGS. 7 and 8 are graphs each indicating a depth profile of each of the constituent elements (N1s, O1s, Al2p, Si2p, Ga3d, and As3d) of the semiconductor laser device as the second embodiment. FIG. 7 indicates the depth profile in the case where the reflectance control layer is formed under the residual oxygen partial pressure of $2 \times 10^{-6}$ in the vacuum chamber, and FIG. 8 indicates the depth profile in the case where the reflectance control layer is formed under the residual oxygen partial pressure of $2 \times 10^{-7}$ in the vacuum chamber.

In each of the cases of FIGS. 5 and 6, the boundary between the semiconductor layers and the first sublayer of the reflectance control layer is considered to be located in the vicinity of the location at which the concentration (atm %) of the group III element contained in the semiconductor layers is equal to the concentration (atm %) of all of the elements constituting the first sublayer of the reflectance control layer except for a nonmetallic element.

In the case of FIG. 5, where the reflectance control layer is formed under the residual oxygen partial pressure of $2 \times 10^{-5}$ in the vacuum chamber, the maximum oxygen concentration at the boundary between the semiconductor layers and the first sublayer of the reflectance control layer in the semiconductor laser device as the first embodiment is about 30 atm %. In FIG. 5, the maximum oxygen concentration at the boundary is obtained as the value of the O1s curve in the vicinity of the intersection point of the Si2p curve and the Ga3d curve, where the Si2p curve indicates the location of the first sublayer (made of Si) of the reflectance control layer, and the Ga3d curve indicates the location of the semiconductor layers which contain Ga.

In the case of FIG. 6, where the reflectance control layer is formed under the residual oxygen partial pressure of $2\times10^{-7}$ in the vacuum chamber, the maximum oxygen concentration at the boundary between the semiconductor layers and the first sublayer of the reflectance control layer in the semiconductor laser device as the first embodiment is about 3.5 atm %. In FIG. 6, the maximum oxygen concentration at the boundary is obtained as the value of the O1s curve in the vicinity of the intersection point of the Si2p curve and the Ga3d curve.

In the case of FIG. 7, where the reflectance control layer is formed under the residual oxygen partial pressure of $2\times10^{-6}$ in the vacuum chamber, the maximum oxygen concentration at the boundary between the semiconductor layers and the first sublayer of the reflectance control layer in the semiconductor laser device as the second embodiment is about 14 atm %. In FIG. 7, the maximum oxygen concentration at the boundary is obtained as the value of the O1s curve in the vicinity of the intersection point of the Al2p curve and the Ga3d curve, where the Al2p curve indicates the location of the first sublayer (made of AlN) of the reflectance control layer, and the Ga3d curve indicates the location of the semiconductor layers which contain Ga.

In the case of FIG. 8, where the reflectance control layer is formed under the residual oxygen partial pressure of $2\times10^{-7}$ in the vacuum chamber, the maximum oxygen concentration at the boundary between the semiconductor layers and the first sublayer of the reflectance control layer in the semiconductor laser device as the second embodiment is about 2 atm %. In FIG. 8, the maximum oxygen concentration at the boundary is obtained as the value of the O1s curve in the vicinity of the intersection point of the Al2p curve and the Ga3d curve.

Figure 9:
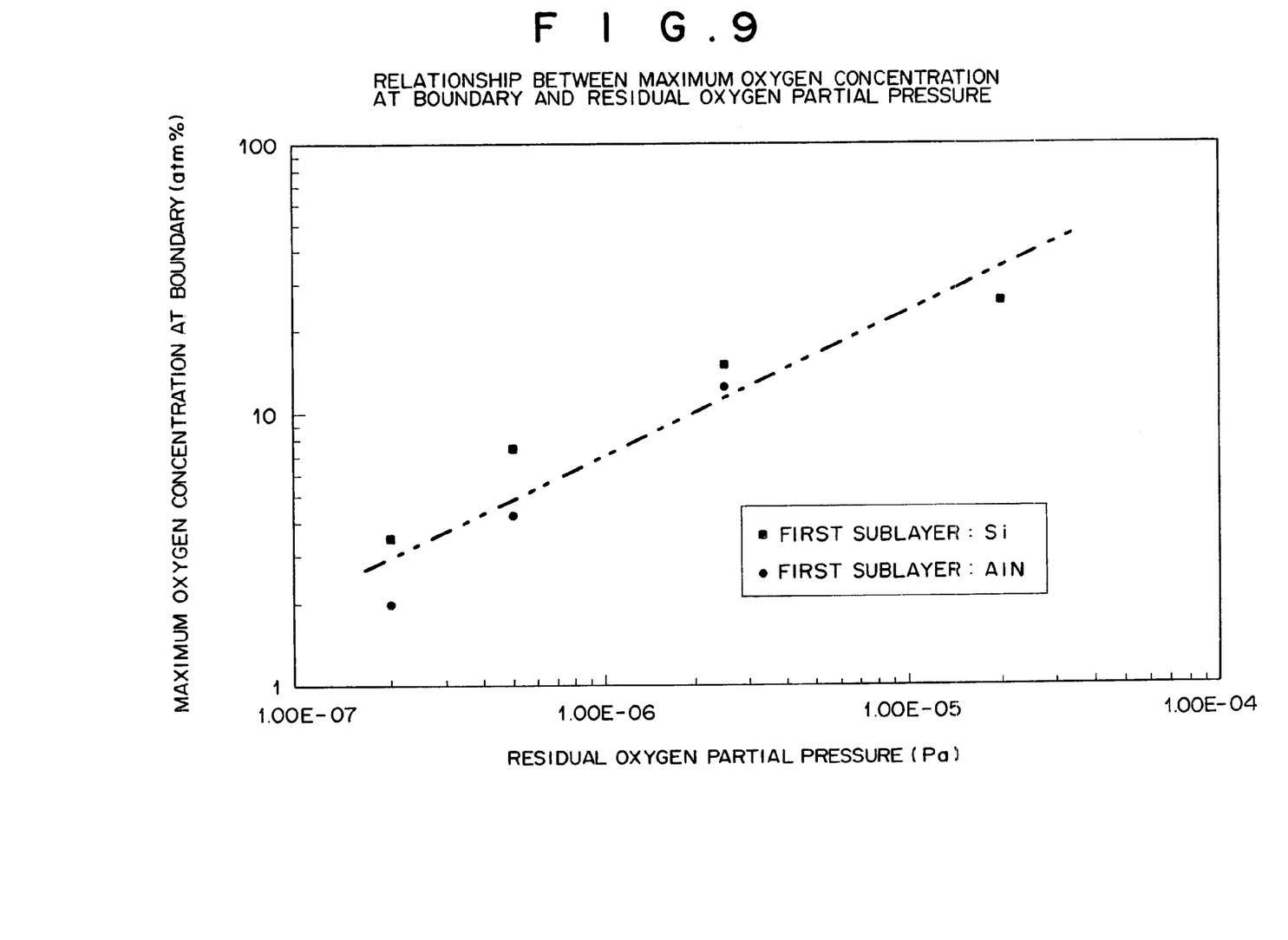
FIG. 9 is a graph indicating a relationship between the residual oxygen partial pressure in the vacuum chamber and the maximum oxygen concentration at the boundary.

A relationship between the maximum oxygen concentration at the boundary between the semiconductor layers and the reflectance control layer and the residual oxygen partial pressure in the vacuum chamber under which the reflectance control layer is formed is indicated in FIG. 9. The relationship of FIG. 9 is based on the results of FIGS. 5 to 8 and additional data. As indicated in FIG. 9, the maximum oxygen concentration at the boundary between the semiconductor layers and the reflectance control layer increases with the residual oxygen partial pressure in the vacuum chamber. That is, the maximum oxygen concentration at the boundary between the semiconductor layers and the reflectance control layer can be very effectively reduced by decreasing the residual oxygen partial pressure in the vacuum chamber.

Figure 10:
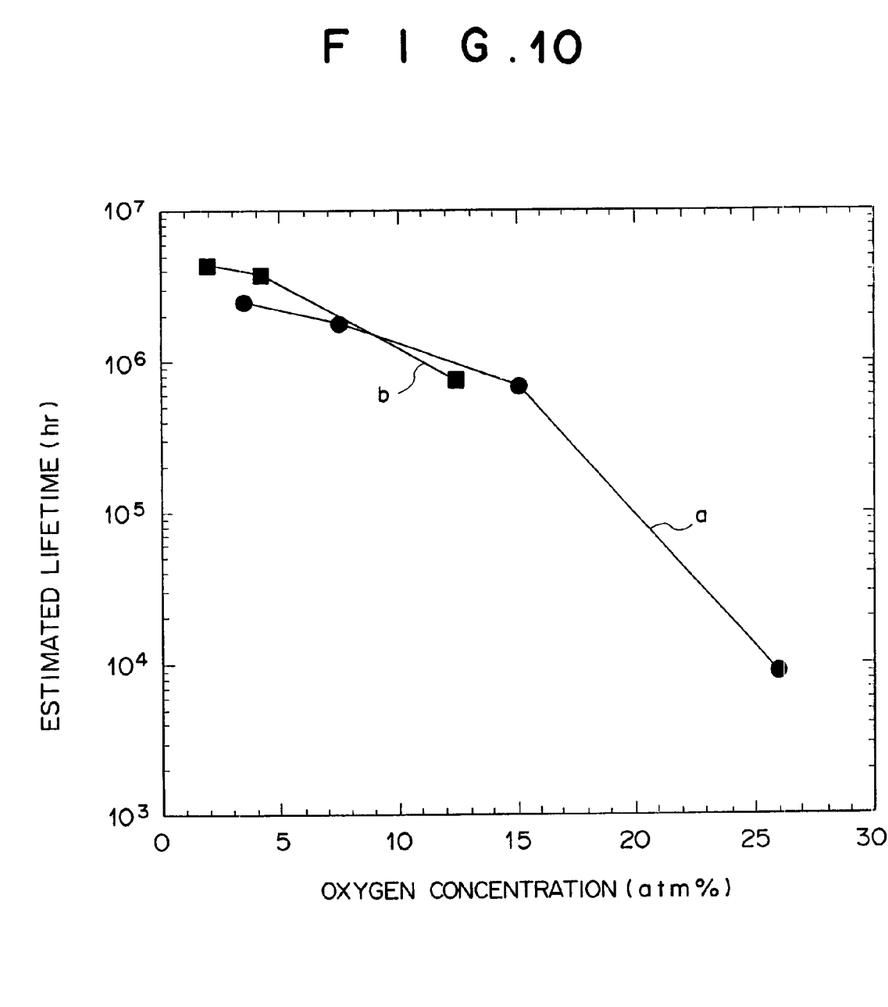
FIG. 10 is a graph indicating a relationship between the maximum oxygen concentration at the boundary and the lifetime of the semiconductor laser device.

Next, reliability evaluations are performed on semiconductor laser devices which are produced by forming the aforementioned laser bars, cleaving the laser bars into chips having a width of 500 to 550 nm, and fixing each chip to a heatsink made of Cu, CuW, or the like, with a brazing material (e.g., In or AuSn). A relationship between the maximum oxygen concentration at the boundary and the lifetime of the semiconductor laser device is indicated in FIG. 10. The reliability test is conducted with the output power of 1 W at a temperature of 50° C. A median value of the increase in the driving current per unit time is obtained during a test operation for 200 to 1,000 hours, and the operation time which causes 10% increase in the driving current from its initial value is obtained, based on the median value, as an estimated lifetime of each semiconductor laser device. In FIG. 10, the plot a is obtained from the semiconductor laser devices as the first embodiment in which the first sublayer of the reflectance control layer is made of Si, and the plot b is obtained from the semiconductor laser devices as the second embodiment in which the first sublayer of the reflectance control layer is made of AlN.

As indicated in FIG. 10, the estimated lifetime increases with the decrease in the maximum oxygen concentration at the boundary. In particular, when the maximum oxygen concentration at the boundary between the semiconductor layers and the reflectance control layer is maintained at or below 15 atm % according to the present invention, the lifetime of the semiconductor laser device becomes $10^6$ hours or more, i.e., the reliability can be increased.

The reflectance control layers in the semiconductor laser devices as the first and second embodiments of the present invention can be realized by using a vacuum film-forming apparatus having a function of milling semiconductor surfaces and a plurality of evaporation sources which enable formation of a plurality of layers of different compositions. To be specific, an ion gun is used in the milling operation, and the electron beam evaporation, sputtering, ECR sputtering, ion beam sputtering, or CVD (chemical vapor deposition) systems can be used as the evaporation sources.

Additional Matters (i) The present invention is not limited to the above embodiments, and can be applied to other semiconductor laser devices having different constructions and compositions. That is, the present invention can be applied to semiconductor laser devices which are made of group III–V compounds. Typical examples of the group III–V compounds are InGaN materials realizing oscillation wavelengths of 360 to 500 nm, ZnSSe materials realizing oscillation wavelengths of 410 to 540 nm, InGaAlP materials realizing oscillation wavelengths of 600 to 730 nm, AlGaAs materials realizing oscillation wavelengths of 750 to 870 nm, InGaAsP materials realizing oscillation wavelengths of 700 to 1,200 nm and 1,300 to 1,900 nm, InGaAs materials realizing oscillation wavelengths of 950 to 1,200 nm and 1,300 to 1,900 nm, and InGaSb materials realizing oscillation wavelengths of 1.8 to 3.0 micrometers, where "XY materials" means materials which contains at least the elements X and Y when each of X and Y is a symbol of an element.

What is claimed is:

1. A semiconductor laser device comprising:
   a multilayered structure being formed of a plurality of semiconductor layers made of a plurality of group III–V compounds, and having a pair of opposite light-exit end facets; and
   a reflectance control layer being formed on at least one of said pair of light-exit end facets, and having at least two sublayers;
   a region near a boundary between said multilayered structure and one of said at least two sublayers closest to said semiconductor layers of said reflectance control layer of said semiconductor laser device has an oxygen concentration of 15 atm % or below.

2. A semiconductor laser device according to claim 1, wherein said one of said at least two sublayers closest to said semiconductor layers is made of a group IV element.

3. A semiconductor laser device according to claim 2, wherein said one of said at least two sublayers closest to said semiconductor layers is made of Si, Ge, or a compound of Si and Ge.

4. A semiconductor laser device according to claim 2, wherein said one of said at least two sublayers closest to said semiconductor layers has a thickness of 0.2 to 50 nm.

5. A semiconductor laser device according to claim 1, wherein said one of said at least two sublayers closest to said semiconductor layers is made of at least one metallic element.

6. A semiconductor laser device according to claim 5, wherein said one of said at least two sublayers closest to said semiconductor layers is made of one of Al, Ti, Ta, Mn, Cr, V, and Sb, or a compound of at least two of Al, Ti, Ta, Mn, Cr, V, and Sb.

7. A semiconductor laser device according to claim 5, wherein said one of said at least two sublayers closest to said semiconductor layers has a thickness of 0.2 to 5 nm.

8. A semiconductor laser device according to claim 1, wherein said one of said at least two sublayers closest to said semiconductor layers is made of a nitride.

9. A semiconductor laser device according to claim 8, wherein, in said nitride, nitrogen is coupled to at least one of B, Al, In, Ga, Si, Ti, and Ta.

10. A semiconductor laser device according to claim 8, wherein said one of said at least two sublayers closest to said semiconductor layers has a thickness of 30 to 1,000 nm.

* * * * *